US009865745B2

(12) United States Patent
Lin et al.

(10) Patent No.: US 9,865,745 B2
(45) Date of Patent: Jan. 9, 2018

(54) THIN-FILM TRANSISTOR AND METHOD FOR FORMING THE SAME

(71) Applicant: AU Optronics Corp., Hsin-Chu (TW)

(72) Inventors: Liang-Yu Lin, Hsin-Chu (TW); Chun-Cheng Cheng, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/011,794

(22) Filed: Feb. 1, 2016

(65) Prior Publication Data

US 2017/0005199 A1    Jan. 5, 2017

(30) Foreign Application Priority Data

Jul. 3, 2015    (TW) .............................. 104121727 A (51) Int. Cl.
*H01L 29/786*    (2006.01)
*H01L 21/02*    (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ........... C08F 220/14; H01L 2924/0002; H01L 29/7869; H01L 29/42384; H01L 29/4908;
(Continued)

(56) References Cited

U.S. PATENT DOCUMENTS 6,057,038 A * 5/2000 Terashita .............. B08B 7/0057
252/299.01
7,576,394 B2    8/2009 Furuta et al.
(Continued)

FOREIGN PATENT DOCUMENTS

CN          1909260 A      2/2007
CN        101326644 A     12/2008
(Continued)

OTHER PUBLICATIONS

Office Action issued in corresponding Taiwan patent application dated Aug. 22, 2016.
(Continued)

*Primary Examiner* — David Vu
*Assistant Examiner* — Jonathan Han
(74) *Attorney, Agent, or Firm* — McClure, Qualey & Rodack, LLP (57) ABSTRACT

A thin-film transistor comprises a substrate, a first electrode on the top surface of the substrate, an insulation layer on the top surface of the substrate and covering the first electrode, a semiconductor oxide layer on the top surface of the insulation layer, a protection layer on the top surface of the semiconductor oxide layer, an organic dielectric layer on the top surface of the semiconductor oxide layer and covering the protection layer, a source electrode and a drain electrode both penetrating the organic dielectric layer from the top surface thereof. A channel thickness of the semiconductor oxide layer is not thicker than 20 nanometers. The source electrode contacts the semiconductor oxide layer at the first side of the protection layer and the drain electrode contacts the semiconductor oxide layer at the second side, opposite to the first side, of the protection layer.

7 Claims, 10 Drawing Sheets

(51) Int. Cl.
*H01L 29/24* (2006.01)
*H01L 29/66* (2006.01)

(52) U.S. Cl.
CPC ........ *H01L 21/02628* (2013.01); *H01L 29/24* (2013.01); *H01L 29/242* (2013.01); *H01L 29/66969* (2013.01); *H01L 29/78618* (2013.01); *H01L 29/78696* (2013.01)

(58) Field of Classification Search
CPC ........... H01L 29/78606; H01L 27/1214; H01L 29/517
USPC ..... 257/E27.111, E21.414, E29.151; 438/99, 438/149, 151; 15/E27.111, E21.414, 15/E29.151
See application file for complete search history.

(56) References Cited

U.S. PATENT DOCUMENTS

| | | | |
|---|---|---|---|
| 7,682,886 B2* | 3/2010 | Kim | H01L 51/0533 257/40 |
| 8,304,773 B2 | 11/2012 | Shimada | |
| 8,679,905 B2 | 3/2014 | Shieh et al. | |
| 2004/0061118 A1* | 4/2004 | Yamazaki | H01L 51/5259 257/79 |
| 2007/0105285 A1* | 5/2007 | Kusumoto | B82Y 10/00 438/151 |
| 2012/0161125 A1* | 6/2012 | Yamazaki | H01L 29/7869 257/43 |
| 2012/0223314 A1 | 9/2012 | Marks et al. | |
| 2013/0256673 A1* | 10/2013 | Nishiyama | H01L 29/78606 257/59 |

FOREIGN PATENT DOCUMENTS

| | | |
|---|---|---|
| CN | 101884110 | 11/2010 |
| CN | 103650121 A | 3/2014 |
| JP | 2012089859 A | 5/2012 |
| TW | 201202274 A | 1/2012 |
| TW | I418039 | 4/2012 |

OTHER PUBLICATIONS

Office Action issued in corresponding China patent application dated Sep. 4, 2017.

* cited by examiner

THIN-FILM TRANSISTOR AND METHOD FOR FORMING THE SAME

CROSS-REFERENCE TO RELATED APPLICATIONS

This non-provisional application claims priority under 35 U.S.C. §119(a) on Patent Application No(s). 104121727 filed in Taiwan, R.O.C. on Jul. 3, 2015, the entire contents of which are hereby incorporated by reference.

TECHNICAL FIELD

The disclosure relates to a thin-film transistor and a fabrication method thereof, more particularly to a thin-film transistor having a semiconductor channel portion having a high stability, and a fabrication method thereof.

BACKGROUND

Figure 1A:
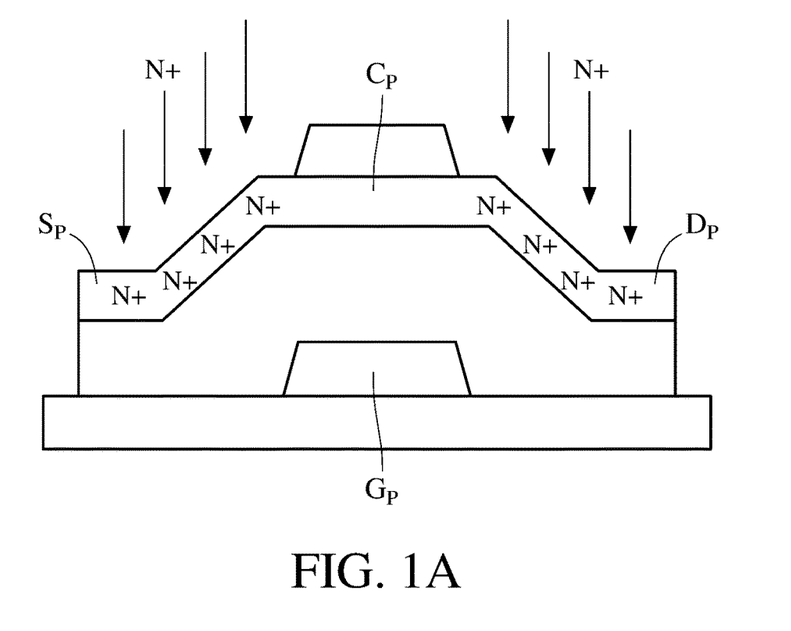
FIG. 1A is a schematic view of forming a conductor (N+) area in a conventional thin-film transistor.

With the thin-film transistor technology, transistor switches in a microelectronic circuit can be fulfilled in a display panel whereby the thin-film transistor technology has popularly been applied to display products. As shown in FIG. 1A, while the conductivity of the contact area of the source electrode $S_P$ and the conductivity of the contact area of the drain electrode $D_P$ in the thin-film transistor increase, the electrode areas of the source electrode and the drain electrode in the thin-film transistor have a lower resistivity and a higher electron mobility.

As shown in FIG. 1A, the conventional method of forming conductor ($N^+$) areas in a thin-film transistor is to dope charged ions into the contact area of the source electrode $S_P$ and the contact area of the drain electrode $D_P$ in the thin-film transistor in order to increase the conductivity of the contact area of the source electrode $S_P$ and the conductivity the contact area of the drain electrode $D_P$. However, the charged ions used in this conventional method easily diffuse to a semiconductor channel $C_P$ in the thin-film transistor so that the electrical characteristics of the thin-film transistor are unstable.

Figure 1B:
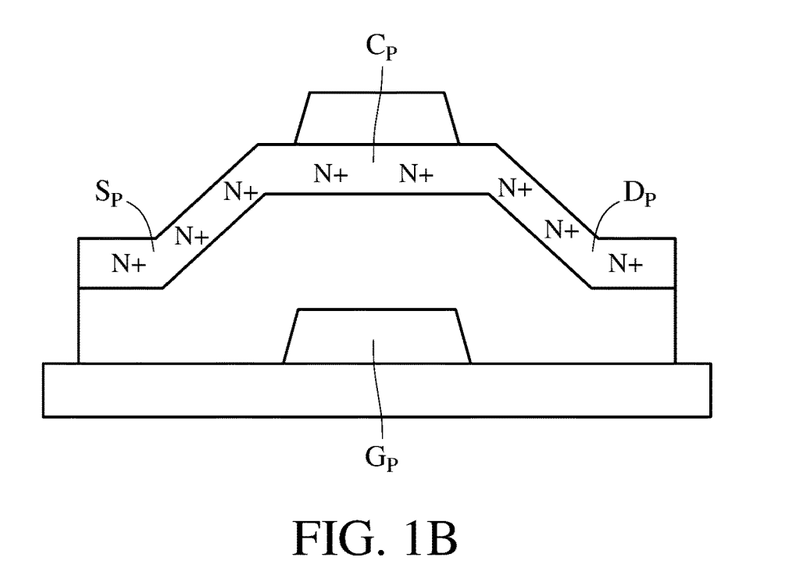
FIG. 1B is a schematic view of the conductive portion diffusing in the conventional thin-film transistor applied by the follow-up process, such as heating.
Figure 1C:
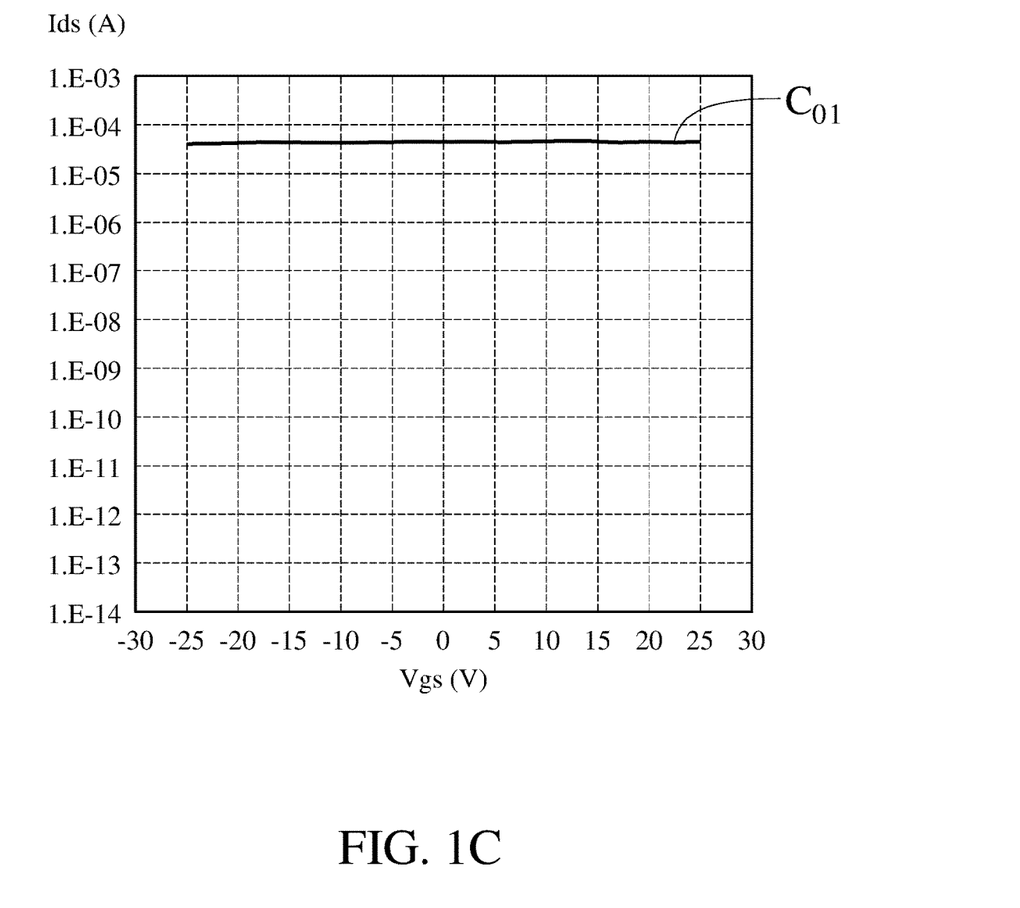
FIG. 1C is a schematic diagram of a relationship of current and voltage of the thin-film transistor in FIG. 1B.

Also, referring to FIG. 1B and FIG. 1C, after the thin-film transistor in FIG. 1A is subjected to a follow-up process (e.g. heating), the doped charged ions (e.g. hydrogen ions) may diffuse to the semiconductor channel $C_P$, resulting in the source electrode $S_P$ and the drain electrode $D_P$ in the thin-film transistor being substantially conducted. Therefore, no matter if the gate electrode $G_P$ is applied with a voltage, the equivalent resistance of the thin-film transistor is substantially unchanged. Also, the relationship of the current flowing through the thin-film transistor and the voltage on the gate electrode is shown by the curve $C_{01}$ in FIG. 1C, where the current flowing through the thin-film transistor is substantially unchanged with the variation of the voltage on the gate electrode.

Without the property of a voltage control current source, such thin-film transistors cannot be used as digital transistor switches or analog transistor amplifiers.

SUMMARY

According to one or more embodiments, the disclosure provides a thin-film transistor. In one embodiment, the thin-film transistor includes a substrate, a gate electrode, a gate insulator layer, a semiconductor oxide layer, a protection layer, an organic dielectric layer, a source electrode, and a drain electrode. The gate electrode is disposed on a top surface of the substrate. The gate insulator layer covers on the gate electrode and a part of the top surface of the substrate. The semiconductor oxide layer is disposed on a top surface of the gate insulator layer. The protection layer is disposed on a top surface of the semiconductor oxide layer. The organic dielectric layer is disposed on the top surface of the semiconductor oxide layer and covers the protection layer, and the organic dielectric layer includes a plurality of through holes. The source electrode and the drain electrode respectively penetrate through the through holes of the organic dielectric layer from the top surface of the organic dielectric layer and contact the semiconductor oxide layer. A thickness of the semiconductor oxide layer is not larger than 20 nanometers (nm). A portion of the semiconductor oxide layer, covered by the protection layer, is a semiconductor channel, and the through holes correspond to a portion of the semiconductor oxide layer uncovered by the protection layer. The source electrode and the drain electrode contact the semiconductor oxide layer through the corresponding through holes, respectively.

According to one or more embodiments, the disclosure provides a fabrication method of a thin-film transistor. In an embodiment, the fabrication method includes the following steps. Form a gate electrode on a top surface of a substrate. Form a gate insulator layer on a portion of the top surface of the substrate and the gate electrode. Form a semiconductor oxide layer on a top surface of the gate insulator layer. A thickness of the semiconductor oxide layer is not larger than 20 nm. Form a protection layer on a top surface of the semiconductor oxide layer. A portion of semiconductor oxide layer covered by the protection layer is defined as a semiconductor channel. Form an organic dielectric layer on the protection layer and a portion of the semiconductor oxide layer. Pattern the organic dielectric layer to form a plurality of through holes passing through the organic dielectric layer. Respectively deposit a source electrode and a drain electrode on the organic dielectric layer. The source electrode and the drain electrode contact the semiconductor oxide layer through the corresponding through holes, respectively.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2A:
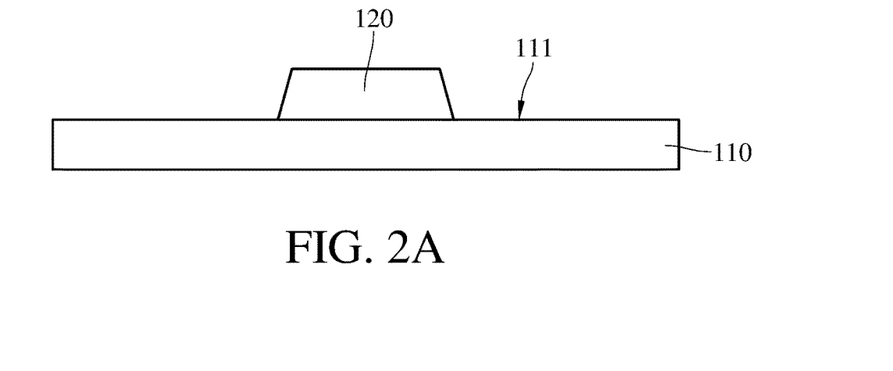
FIG. 2A to FIG. 2G are schematic views of steps of a fabrication method of the thin-film transistor, respectively.
Figure 2B:
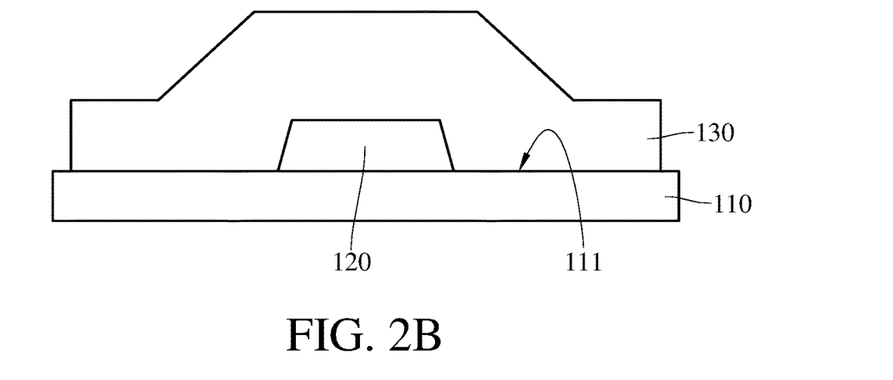
Figure 2C:
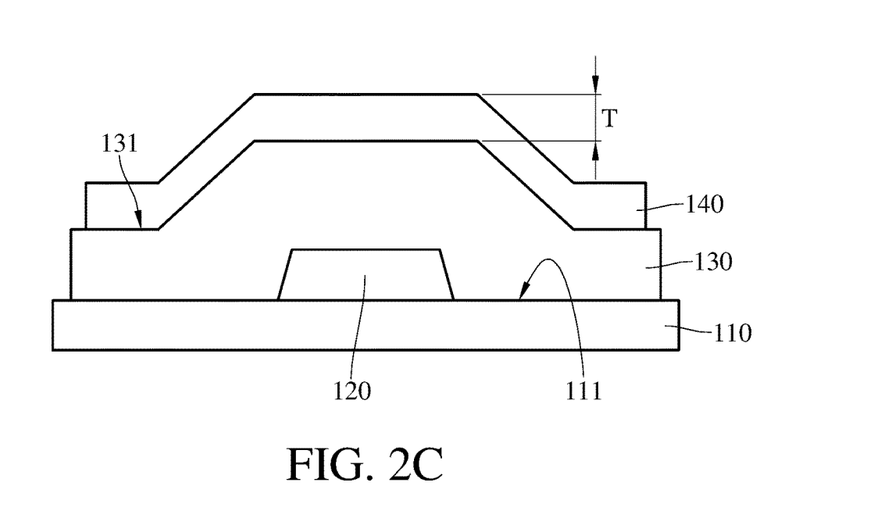
Figure 2D:
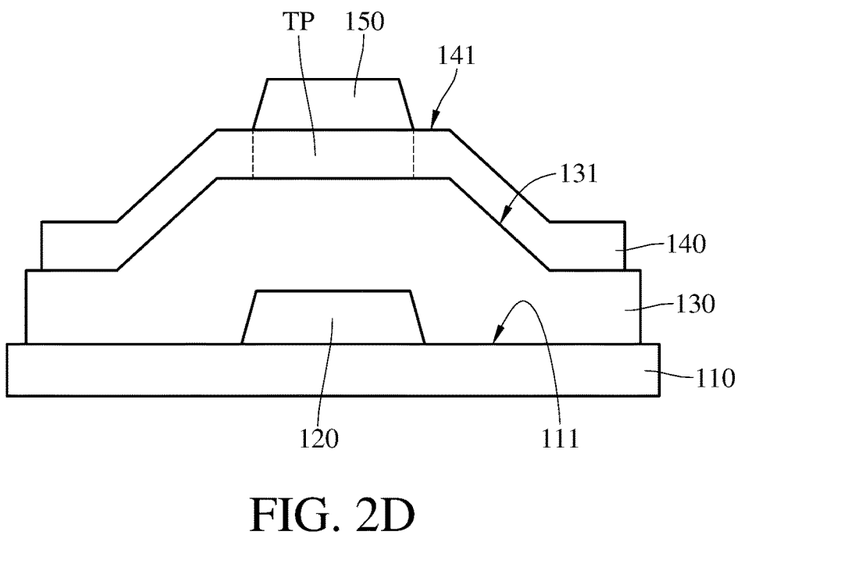
Figure 2E:
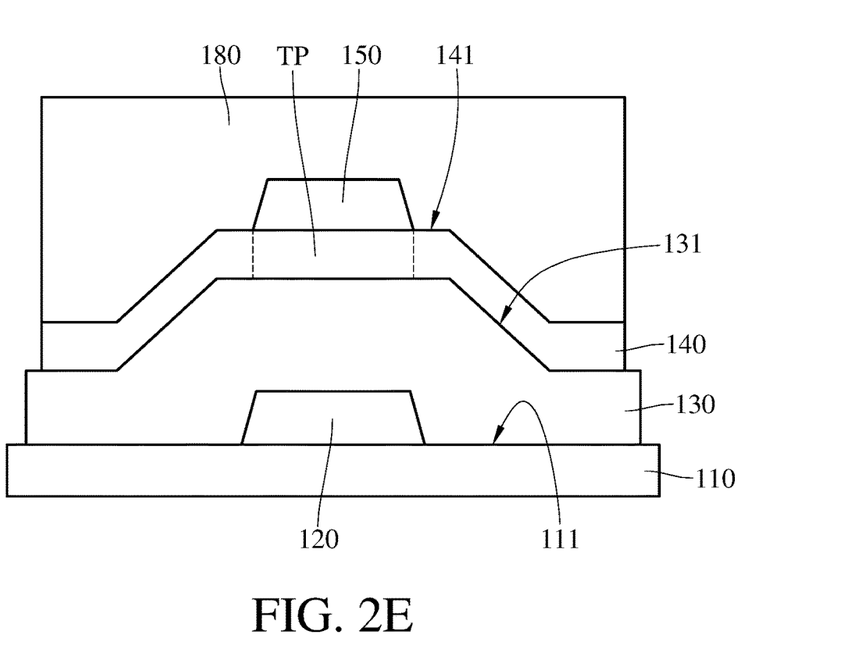
Figure 2F:
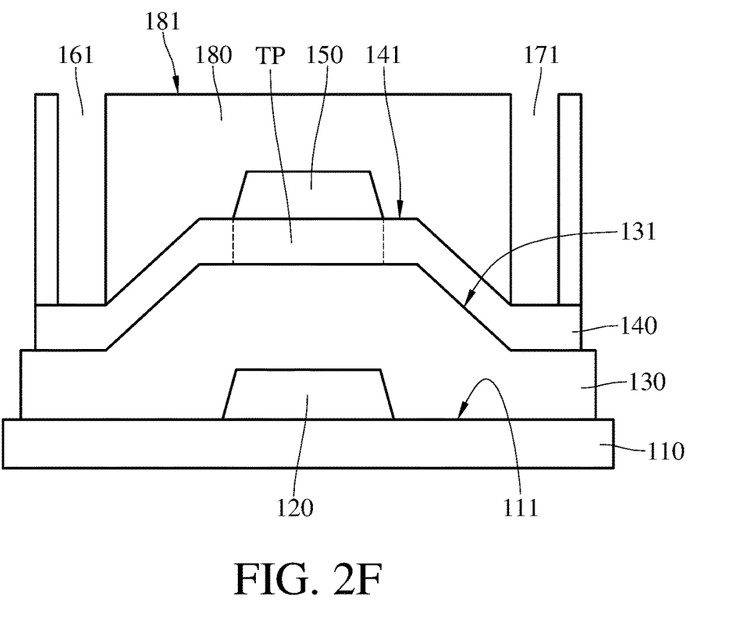

Please refer to FIG. 2A to FIG. 2G, which are schematic views of steps of a fabrication method of the thin-film transistor in an embodiment, respectively. The fabrication method includes the following steps. As shown in FIG. 2A, a gate electrode 120 is formed on a top surface 111 of a substrate 110. As shown in FIG. 2B, a gate insulator layer 130 is formed on the top surface 111 of the substrate 110 and covers on the gate electrode 120. As shown in FIG. 2C, a semiconductor oxide layer 140 is formed on a top surface 131 of the gate insulator layer 130 and the semiconductor oxide layer 140 is patterned to define its shape and size. The thickness T of the semiconductor oxide layer 140 is not larger than 20 nm. As shown in FIG. 2D, a protection layer 150 is formed on a top surface 141 of the semiconductor oxide layer 140. As shown in FIG. 2E, an organic dielectric layer 180 is formed on the top surface 141 of the semiconductor oxide layer 140 and the protection layer 150 which is patterned to define its shape and size. As shown in FIG. 2F, a through hole 161 and a through hole 171 are formed by a patterning process, and both the through hole 161 and the through hole 171 penetrate the organic dielectric layer 180 from a top surface 181 of the organic dielectric layer 180 to exposure portion of the top surface 141 of the semiconductor oxide layer 140.

In another embodiment, a patterned organic dielectric layer 180 is directly formed after the protection layer 150 is formed. In other words, the above processes shown in FIGS. 2E and 2F are performed in the same step.

The protection layer 150 defines a semiconductor channel TP. Specifically, a portion of the semiconductor oxide layer 140 that the protection layer 150 vertically projects on the semiconductor oxide layer 140 is defined as the semiconductor channel portion TP. Since the protection layer 150 protects the organic dielectric layer 180 (such as photoresist) from directly contacted the semiconductor oxide layer 140, also the metal ions within the semiconductor oxide layer 140 are prevented from being attracted by the organic dielectric layer 180. Therefore, the semiconductor oxide layer 140 has semiconductor characteristics.

Figure 2G:
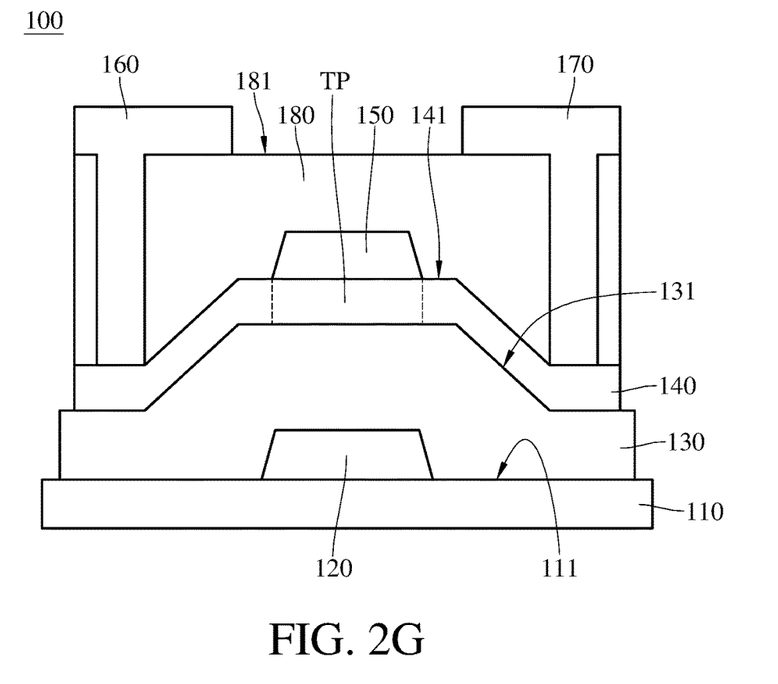

As shown in FIG. 2G, from the top surface 181 of the organic dielectric layer 180, the source electrode 160 and the drain electrode 170 respectively pass through the through hole 161 and the through hole 171 so that the source electrode 160 contacts the top surface 141 of the semiconductor oxide layer 140 through the through hole 161 and the drain electrode 170 contacts the top surface 141 of the semiconductor oxide layer 140 through the through hole 171.

Accordingly, the thin-film transistor 100, as shown in FIG. 2G, includes the substrate 110, the gate electrode 120 on the top surface 111 of the substrate 110, the gate insulator layer 130 covering on both the top surface 111 of the substrate 110 and the gate electrode 120, the semiconductor oxide layer 140 on the top surface 131 of the gate insulator layer 130, the protection layer 150 on the top surface 141 of the semiconductor oxide layer 140, the organic dielectric layer 180 covering both the top surface 141 of the semiconductor oxide layer 140 and the protection layer 150, and the source electrode 160 and the drain electrode 170 both penetrating the organic dielectric layer 180 from the top surface 181 of the organic dielectric layer 180. The thickness T of the semiconductor oxide layer 140 is not larger than 20 nm. The portion of the semiconductor oxide layer 140 covered by the protection layer 150 is called semiconductor channel TP. The source electrode 160 passes through the through hole 161 and contacts the semiconductor oxide layer 140, and the drain electrode 170 passes through the through hole 171 and contacts the second area 141b of the semiconductor oxide layer 140.

In an example, the semiconductor oxide layer 140 is made of metallic oxide, such as indium gallium zinc oxide (IGZO), gallium oxide (Ga2O3), indium oxide (In2O3), zinc oxide (ZnO), indium tin oxide (ITO), indium zinc oxide (IZO), or other suited materials, or a combination thereof. In an example, the protection layer 150 is made of an inorganic isolation material and the inorganic isolation material is selected from one of silicon nitride, silicon dioxide, silicon oxynitride, metallic oxide, or other suited materials, or a combination thereof. In an example, the organic dielectric layer 180 is made of at least one of a group consisting of organic polymer, organic photoresist, organic-inorganic hybrid material, other suited materials, or a combination thereof. More particularly, the organic dielectric layer 180 is made of one of a group consisting of an organic compound with at least a hydroxyl group, an organic compound with an amino group, an organic compound with a mercaptan (referred to as thiol) group, and a combination thereof.

Figure 3:
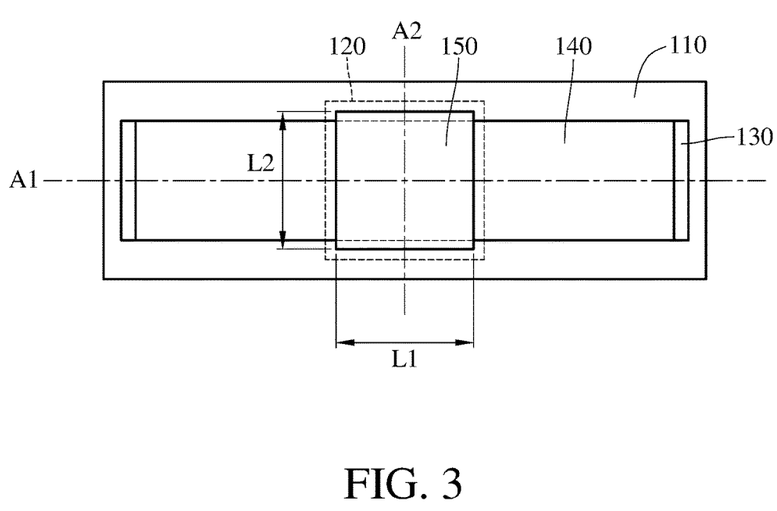
FIG. 3 is a top view of the thin-film transistor in FIG. 2G.

Referring to FIG. 2G and FIG. 3, which is top view of the thin-film transistor in FIG. 2G. The protection layer 150 decides the location of the semiconductor channel TP on the thin-film transistor 100. In the drawing, a first coordinate axis A1 is an axis that passes through both the geometric center (also known as centroid) of the source electrode 160 and the geometric center of the drain electrode 170, and a second coordinate axis A2 is perpendicular to the first coordinate axis A1. The channel length of the thin-film transistor 100 is defined by a length L1 of the protection layer 150 which is parallel to the first coordinate axis A1. The channel width of the semiconductor channel TP in the thin-film transistor 100 is defined by the length L2 of the protection layer 150 which is parallel to the second coordinate axis A2.

In practice, the channel length and channel width of the semiconductor channel TP corresponding to the protection layer 150 can be decided according to the actual application requirements, and the disclosure has no limitation on the lengths L1 and L2. Also, the disclosure has no limitation on the location relationship of the semiconductor oxide layer 140 and the gate electrode 120. For example, the area of the semiconductor oxide layer 140 is larger than the area of the gate electrode 120 (i.e. island out). Alternately, the area of the semiconductor oxide layer 140 is smaller than the area of the gate electrode 120 (i.e. island in) so that the gate electrode 120 protects the semiconductor oxide layer 140 from light influences. The structure of the transistor can be designed and arranged according to actual application requirements, and the disclosure has no limitation therein.

In an embodiment based on the semiconductor oxide layer 140 of indium oxide ($InO_x$), the semiconductor oxide layer 140 includes many crystal lattices constructed by atoms of indium oxide, and the organic dielectric layer 180 is made of organic compounds of hydroxyl group (R—OH), amino group (R=NH or R—NH2) or mercaptan group (R—SH). The following exemplary description is based on the organic dielectric layer 180 made of organic compounds of hydroxyl group (R—OH). In the step shown in FIG. 2E, during the formation of the organic dielectric layer 180 on the top surface 141 of the semiconductor oxide layer 140, because of hydroxyl group (R—OH) in the organic compound may generate hydrogen ions ($H^+$) and anions (R—$O^-$). In the organic dielectric layer 180, the anions (R—$O^-$) of the organic compound close to the top surface 141 of the semiconductor oxide layer 140 attract the indium ions of the above indium oxide such that indium ions radiate from ion pairs of indium oxide. In this way, the semiconductor oxide layer 140 not covered with the protection layer 150 has many negatively-charged ions so that the semiconductor oxide layer 140 not covered with the protection layer 150 has doped semiconductor characteristics.

Since the portion of the semiconductor oxide layer 140 covered by the protection layer 150 does not contact the organic dielectric layer 180, only the semiconductor oxide layer 140 contact the organic dielectric layer 180 has such doped semiconductor characteristics. In other embodiment, the portion of the semiconductor oxide layer 140 covered by the protection layer 150 mainly has a lattice orientation of indium oxide.

Figure 4A:
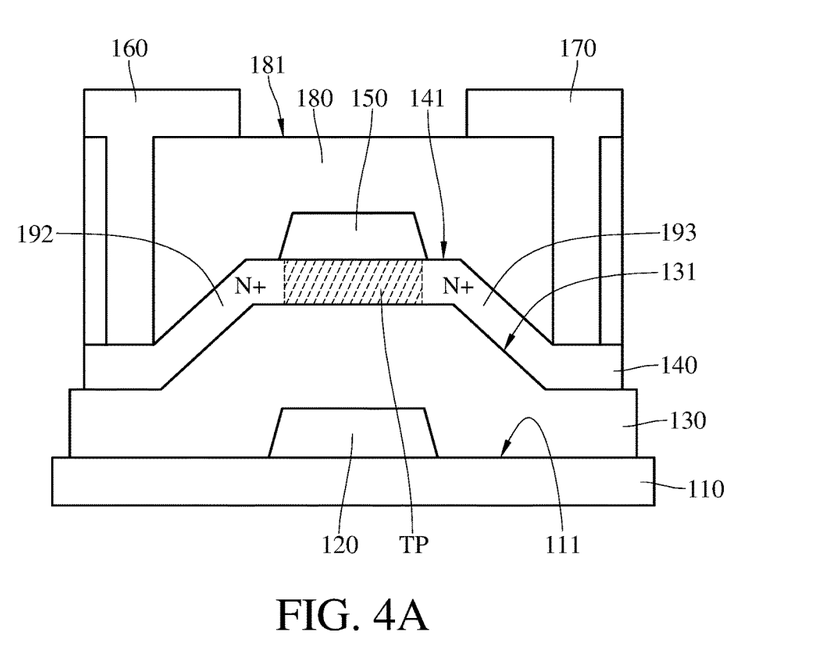
FIG. 4A is a schematic diagram of electric characteristics of the thin-film transistor when the gate electrode of the thin-film transistor is not applied with a driving voltage.
Figure 4B:
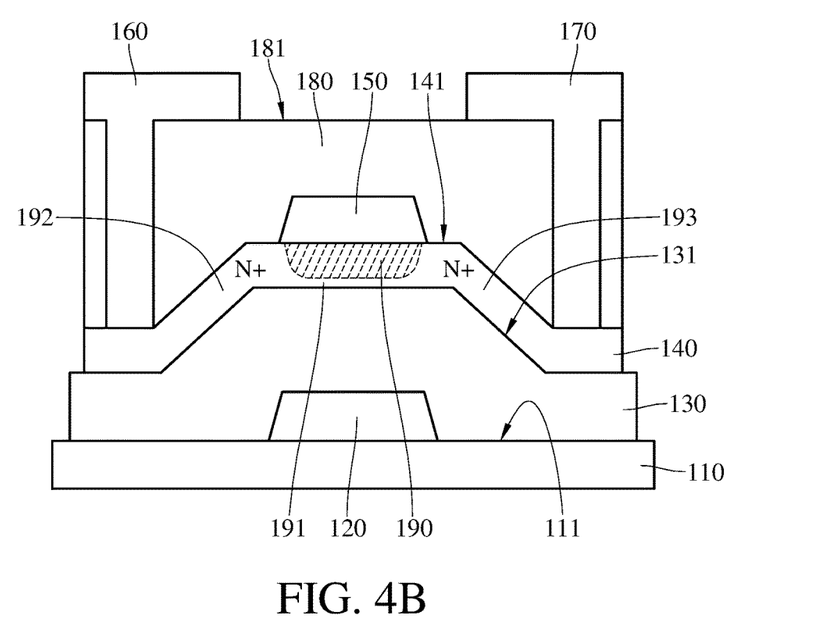
FIG. 4B is a schematic diagram of electric characteristics of the thin-film transistor when the gate electrode of the thin-film transistor is applied with a driving voltage.

Referring to FIG. 2G, FIG. 4A, which is a schematic diagram of electric characteristics of the thin-film transistor 100 when the gate electrode of the thin-film transistor 100 is not applied with a driving voltage, and FIG. 4B, which is a schematic diagram of electric characteristics of the thin-film transistor 100 when the gate electrode of the thin-film transistor is applied with a driving voltage. The gate electrode of the thin-film transistor 100 herein is the same as the gate electrode 120 in FIG. 2G, the source electrode of the thin-film transistor 100 herein is the same as the source electrode 160 in FIG. 2G, and the drain electrode of the thin-film transistor 100 herein is the same as the drain electrode 170 in FIG. 2G.

In FIG. 4A, all the gate electrode 120, the source electrode 160, and the drain electrode 170 are applied with a first voltage (e.g. 0 V), so the portion of the semiconductor oxide layer 140 covered by the protection layer 150 mainly belongs to the semiconductor channel TP. Also, the semiconductor oxide layer 140 not covered by the protection layer 150 has a conductive portion 192 and a conductive portion 193. In other words, there is no charged ion within the semiconductor channel TP, and the semiconductor oxide layer 140 at the conductive portion 192 and the conductive portion 193 has charged ions that are formed when the organic dielectric layer 180 absorbs the metal ions of the semiconductor oxide layer 140. In an example, both the conductive portion 192 and the conductive portion 193 of the semiconductor oxide layer 140 have positively-charged metal ions and negatively-charged oxygen ions both existing individually. The existence of the semiconductor channel TP causes charged carriers (electrons) to difficultly move from the source electrode 160 to the drain electrode 170. In other words, the semiconductor channel between the source electrode 160 and the drain electrode 170 has a quite high equivalent resistance and is like an insulator.

In FIG. 4B, both the source electrode 160 and the drain electrode 170 are applied with a first voltage, the gate electrode 120 is applied with a second voltage, and the second voltage is higher than the first voltage. When the thin-film transistor is turned on, negative charges in the portion of the semiconductor oxide layer 140 covered by the protection layer 150 are attracted by a high voltage. Therefore, a portion of the semiconductor channel TP close to the gate insulator layer 130 has more negative charges and forms a conductive portion 191 connecting the conductive portion 192 and the conductive portion 193 in FIG. 4A to each other. In other words, the semiconductor channel TP is divided into a neutral portion 190 close to the protection layer 150, and the conductive portion 191 close to the gate insulator layer 130. While the second voltage increases, the conductive portion 191 becomes larger. Since the organic compound ions within the organic dielectric layer 180 attract the metal ions of the semiconductor oxide layer 140, the conductive portion 192 and the conductive portion 193 of the semiconductor oxide layer 140 may not diffuse when the thin-film transistor 100 is subjected to a follow-up process (e.g. heating).

In an embodiment, as shown in FIG. 2C and FIG. 2D, the thickness T of a channel in the semiconductor channel TP of the semiconductor oxide layer 140 is not larger than 20 nm, but is larger than 0 nm. In another embodiment, the thickness T is between 8 nm and 10 nm. When the semiconductor oxide layer contacts an organic dielectric material, metal ions are separated from oxygen ions in the ion pairs of metallic oxide, whereby the conductivity of the semiconductor oxide layer increases. If the film thickness is sufficiently thin (e.g. less than 20 nm), the produced metal ions are easily spread around the semiconductor oxide layer. Herein, a junction interface transforms from the semiconductive portion to a conductive portion so that the resistance of the junction interface between the source electrode and the semiconductor oxide layer 140 and the resistance of the junction interface between the drain electrode and the semiconductor oxide layer 140 reduce, that is, the conductivities of these junction interface increase. In another embodiment, the semiconductor oxide layer 140 is formed on the top surface 131 of the gate insulator layer 130 by a solution process. Compared with other fabrication processes, the solution process supports the production of the thinner semiconductor oxide layer 140, thereby more easily forming a channel having a desired thickness T.

Figure 5A:
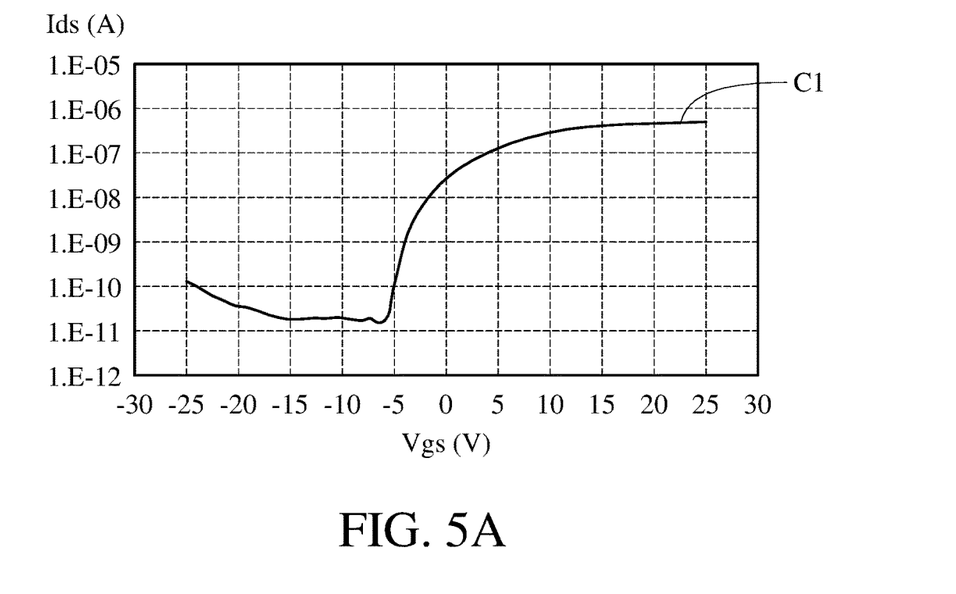
FIG. 5A is a schematic diagram of a relationship of a current and a voltage on the voltage of the gate electrode of the thin-film transistor obtained during experiments.
Figure 5B:
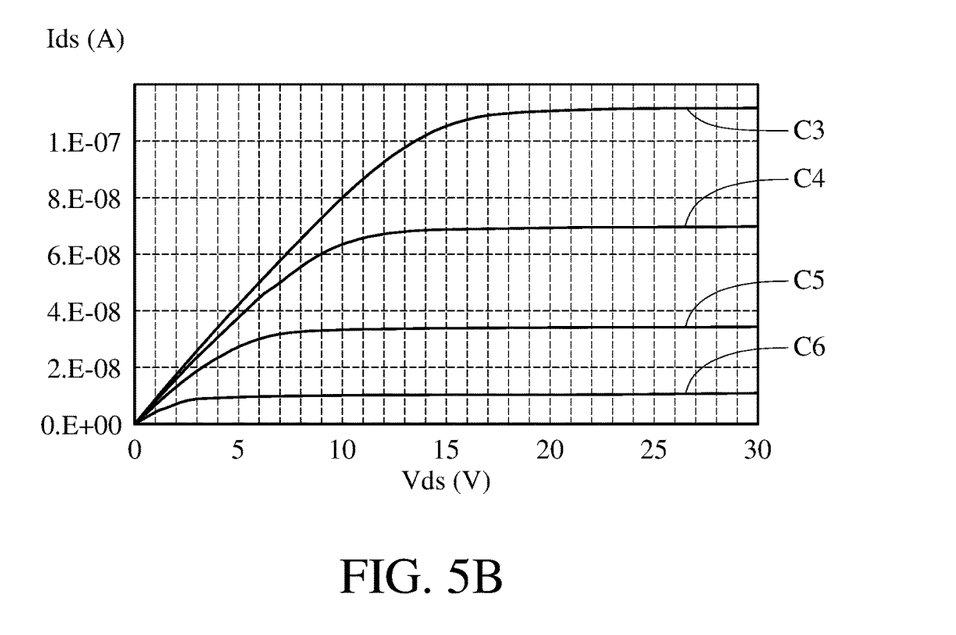
FIG. 5B is a schematic diagram of a relationship of a current and the voltage difference between the drain and source electrodes of the thin-film transistor obtained during experiments.

Referring to FIG. 5A, which is a schematic diagram of a relationship of a current and a voltage on the voltage of the gate electrode of the thin-film transistor obtained during experiments, and to FIG. 5B, which is a schematic diagram of a relationship of a current and the voltage difference between the drain and source electrodes of the thin-film transistor obtained during experiments. In FIG. 5A, a curve C1 represents a relationship of the voltage on the gate electrode and the current following through the thin-film transistor when the voltage on the source electrode is 0 V and the voltage on the drain electrode is 20 V.

In FIG. 5B, a curve C3 represents a relationship of the voltage on the drain electrode and the current following through the thin-film transistor when the voltage on the source electrode is 0 V and the voltage on the gate electrode is 10 V. A curve C4 represents a relationship of the voltage on the drain electrode and the current flowing through the thin-film transistor when the voltage on the source electrode is 0 V and the voltage on the gate electrode is 7 V. A curve C5 represents a relationship of the voltage on the drain electrode and the current flowing through the thin-film transistor when the voltage on the source electrode is 0 V and the voltage on the gate electrode is 4 V. A curve C6 represents a relationship of the voltage on the drain electrode and the current flowing through the thin-film transistor when the voltage on the source electrode is 0 V and the voltage on the gate electrode is 1 V.

Accordingly, the current-voltage characteristics of the thin-film transistor, as shown in FIG. 5A and FIG. 5B, is similar to the current-voltage characteristics of a metal-oxide semiconductor field effect transistor (MOSFET).

Figure 6A:
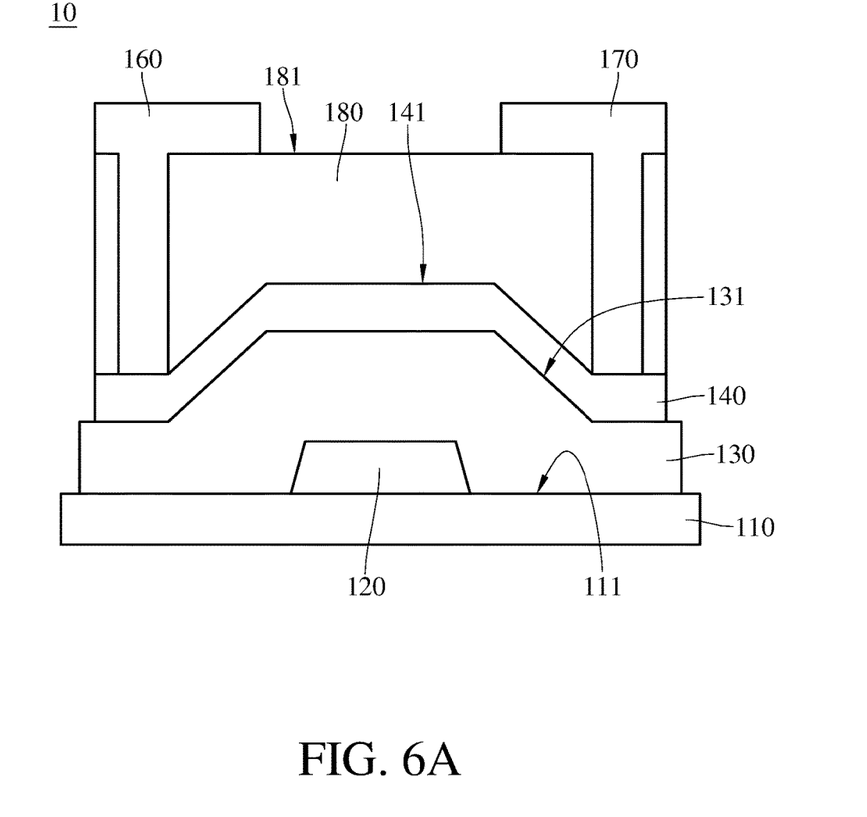
FIG. 6A is a schematic cross-sectional view of the thin-film transistor.
Figure 6B:
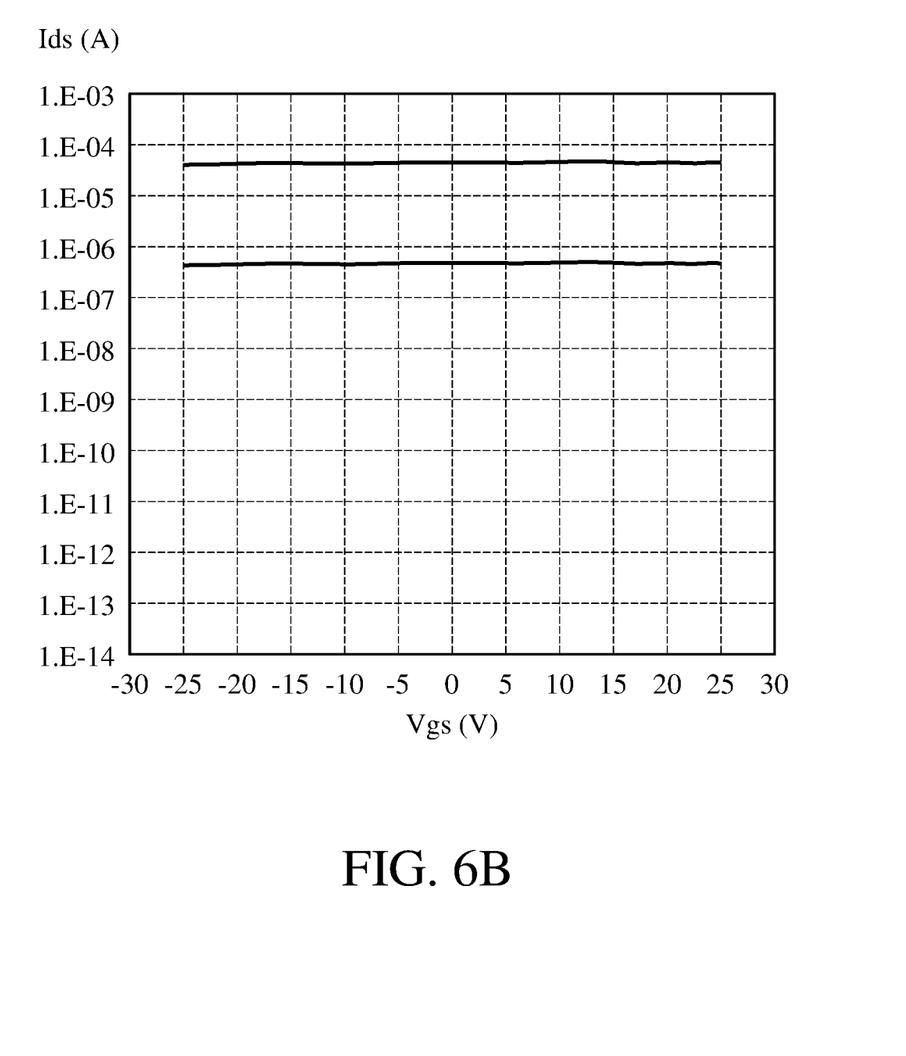
FIG. 6B is a schematic diagram of current-voltage characteristics of the thin-film transistor in FIG. 6A.

In a contract embodiment, another thin-film transistor 10 is as shown in both FIG. 6A, which is a schematic cross-sectional view of the thin-film transistor, and FIG. 6B, which is a schematic diagram of current-voltage characteristics of the thin-film transistor in FIG. 6A. The thin-film transistor 10 in FIG. 6A does not include the protection layer 150 in FIG. 4A.

In this embodiment, the drain electrode of the thin-film transistor 10 is exemplarily applied with a different voltage, resulting in a relationship of the voltage on the gate electrode and the current flowing through the drain electrode, as shown in FIG. 6B. In view of the content shown in FIG. 6B, the person of ordinary skill in the art can realize that the thin-film transistor in FIG. 4A is more adapted to fulfill a voltage control current source in the integrated circuit field than the thin-film transistor 10 in FIG. 6A. This proves that since the semiconductor oxide layer 140 has the semiconductor channel portion TP that is defined by covering the protection layer 150 on the top surface of the semiconductor oxide layer 140, the thin-film transistor 10 has the property of the voltage control current source of a field-effect transistor.

As set forth above, the organic compound ions of the organic dielectric layer (e.g. photoresist) in the thin-film transistor in the disclosure attract the metal ions of the semiconductor oxide layer so that the semiconductor oxide layer at the sides of the source electrode and the drain electrode in the thin-film transistor respectively form a conductive portion. Moreover, the conductive portions within the semiconductor oxide layer may be prevented from diffusing to the semiconductor channel portion after the thin-film transistor is subjected to the follow-up process (e.g. heating). Therefore, the semiconductor characteristics of the thin-film transistor in the disclosure may be more stable than those of conventional thin-film transistors.

What is claimed is:

1. A thin-film transistor, comprising:
   a substrate;
   a gate electrode disposed on a top surface of the substrate;
   a gate insulator layer disposed on the top surface of the substrate and covering on the gate electrode;
   a semiconductor oxide layer disposed on the top surface of the gate insulator layer and comprising a semiconductor channel, and a thickness of the semiconductor oxide layer not being larger than 20 nanometers(nm);
   a protection layer disposed on a top surface of the semiconductor oxide layer and corresponding to the semiconductor channel;
   an organic dielectric layer disposed over both the protection layer and the semiconductor oxide layer, the organic dielectric layer being in contact with a top surface of the protection layer, the organic dielectric layer also being in contact with the top surface of the semiconductor oxide layer on lateral sides of the semiconductor oxide layer, which are not covered by the protection layer, and comprising a plurality of through holes; and
   a source electrode and a drain electrode, disposed on a top surface of the organic dielectric layer and contacting the semiconductor oxide layer through the plurality of through holes.

2. The thin-film transistor according to claim 1, wherein the semiconductor oxide layer is made of metallic oxide, and the metallic oxide is selected from at least one of a group consisting of indium gallium zinc oxide, gallium oxide, indium oxide, zinc oxide, indium tin oxide and a combination thereof.

3. The thin-film transistor according to claim 1, wherein the protection layer is made of an inorganic isolation material, and the inorganic isolation material is selected from at least one of a group consist of silicon nitride, silicon dioxide, silicon oxynitride, metallic oxide, and a combination thereof.

4. The thin-film transistor according to claim 1, wherein the organic dielectric layer is made of at least one of a group consisting of organic polymer, organic photoresist and organic-inorganic hybrid material.

5. The thin-film transistor according to claim 4, wherein the organic dielectric layer is made of an organic compound with a functional group, and the functional group is selected from a group consisting of hydroxyl, amino and mercaptan.

6. The thin-film transistor according to claim 1, wherein the protection layer partially covers the top surface of the semiconductor oxide layer, and a bottom surface of the protection layer is substantially smaller than the top surface of the semiconductor oxide layer.

7. The thin-film transistor according to claim 6, wherein an area of the protection layer is substantially the same as an area of the semiconductor channel.

* * * * *